(12) United States Patent
Kim

(10) Patent No.: US 6,235,601 B1
(45) Date of Patent: May 22, 2001

(54) METHOD OF MANUFACTURING A SELF-ALIGNED VERTICAL BIPOLAR TRANSISTOR

(75) Inventor: Manjin J. Kim, Hartsdale, NY (US)

(73) Assignee: Philips Electronics North America Corporation, New York, NY (US)

( * ) Notice: Subject to any disclaimer, the term of this patent is extended or adjusted under 35 U.S.C. 154(b) by 0 days.

(21) Appl. No.: 08/934,301

(22) Filed: Sep. 19, 1997

Related U.S. Application Data

(63) Continuation of application No. 08/579,703, filed on Dec. 28, 1995, now abandoned.

(51) Int. Cl.$^7$ .................................................. H01L 21/331
(52) U.S. Cl. ..................... 438/348; 438/350; 438/357; 438/364; 438/370; 438/526; 438/579; 438/653; 438/149; 438/655; 438/657; 148/DIG. 10; 148/DIG. 150
(58) Field of Search .................................. 438/350, 348, 438/357, 364, 370, 526, 579, 652, 653, 149, 655, 657, FOR 160, FOR 165, FOR 322, FOR 346, FOR 350; 148/DIG. 11, DIG. 10, DIG. 150

(56) References Cited

U.S. PATENT DOCUMENTS

| 4,735,911 | * | 4/1988 | Schaber ................................ 437/33 |
| 4,755,476 | * | 7/1988 | Bohm et al. ......................... 437/31 |
| 5,049,513 | * | 9/1991 | Eklund ................................. 437/31 |
| 5,087,580 | * | 2/1992 | Eklund ................................. 437/21 |
| 5,100,810 | * | 3/1992 | Yoshimi et al. ..................... 437/21 |
| 5,102,809 | * | 4/1992 | Eklund et al. ....................... 437/21 |
| 5,196,356 | * | 3/1993 | Won et al. ........................... 437/31 |
| 5,198,372 | * | 3/1993 | Verret .................................. 437/31 |
| 5,221,853 | * | 6/1993 | Joshi et al. ......................... 257/384 |
| 5,232,861 | * | 8/1993 | Miwa .................................... 437/31 |
| 5,241,211 |   | 8/1993 | Tashiro ................................ 257/506 |
| 5,242,847 | * | 9/1993 | Ozturk et al. ....................... 437/41 |
| 5,256,896 |   | 10/1993 | Ning ................................... 257/585 |
| 5,279,976 | * | 1/1994 | Hayden et al. ..................... 437/31 |
| 5,302,535 | * | 4/1994 | Imai et al. .......................... 437/31 |
| 5,322,805 | * | 6/1994 | Allman et al. ...................... 437/31 |
| 5,342,794 | * | 8/1994 | Wei ..................................... 437/31 |
| 5,403,757 | * | 4/1995 | Suzuki ................................ 437/31 |
| 5,403,758 | * | 4/1995 | Yoshihara ........................... 437/31 |
| 5,407,847 | * | 4/1995 | Hayden et al. ..................... 437/44 |
| 5,409,843 | * | 4/1995 | Yamauchi et al. .................. 437/31 |
| 5,424,228 | * | 6/1995 | Imai .................................... 437/31 |
| 5,439,833 | * | 8/1995 | Hebert et al. ...................... 437/31 |
| 5,496,744 | * | 3/1996 | Ishimaru ............................ 437/31 |
| 5,593,905 | * | 1/1997 | Johnson et al. ............... 148/DIG. 10 |

FOREIGN PATENT DOCUMENTS

| 0575283A2 | 12/1993 | (EP) . |
| 1-289124 | 11/1989 | (JP) . |
| 3203333 | 12/1989 | (JP) . |
| 4251935 | 9/1992 | (JP) . |
| 5175327 | 7/1993 | (JP) . |

OTHER PUBLICATIONS

"An Advanced Single–Level Polysilicon Submicrometer BiCMOS Technology", by Michael P. Brassington et al, IEEE Trans. on Electron Devices, vol. 36, No. 4, Apr. 1989, pp 712–719.

"MO$_2$M/Mo Gate MOSFET's", by Manjin J. Kim et al, IEEE Trans. on Electron Devices, vol. ED–30, No. 6, Jun. 1983, pp 598–602.

* cited by examiner

Primary Examiner—Long Pham
(74) Attorney, Agent, or Firm—Steven R. Biren

(57) ABSTRACT

A process is set forth for providing a self-aligned, vertical bipolar transistor. A controlled technique is provided for providing the base and emitter features of the transistor with appropriate dimensions and properties to be useful in high frequency microwave applications. A microwave transistor is provided by this technique.

17 Claims, 3 Drawing Sheets

METHOD OF MANUFACTURING A SELF-ALIGNED VERTICAL BIPOLAR TRANSISTOR

CROSS REFERENCE TO RELATED APPLICATIONS

Figure 1:
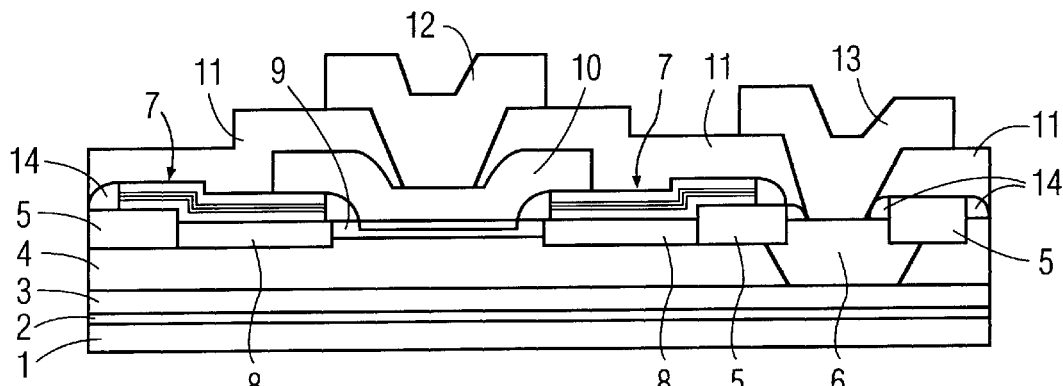
Figure 2:
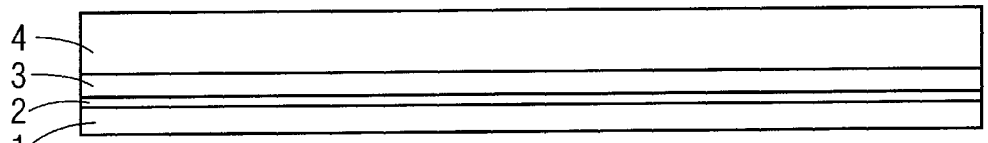
Figure 3:
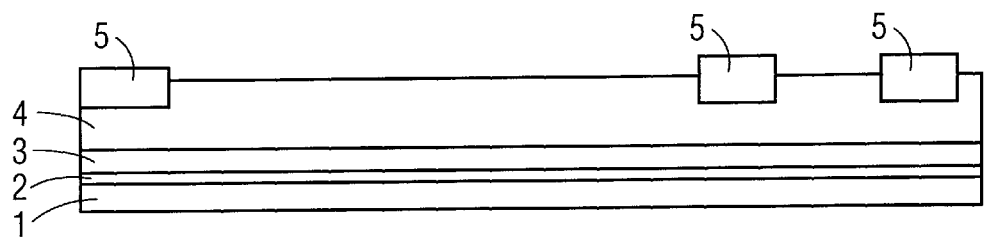

This is a continuation of application Ser. No. 08/579,703 filed Dec. 28, 1995, now abandoned.

FIELD OF INVENTION

The present invention is directed to a technique for manufacturing a self-aligned vertical bipolar transistor on an SOI device. More particularly, the present invention forms such device in a manner to closely control the device dimensions and form a highly conductive base structure of a multiple conductive stack for use in high frequency devices for microwave applications.

BACKGROUND OF THE INVENTION

In communication systems operating at less than 10 Ghz, silicon bipolar transistors can be used. The making of devices for microwave applications has been expensive such as for the making of bipolar MMIC devices using conventional bulk silicon technology. This problem occurs because of the process complexity associated with buried collectors and isolation of the parts.

The making of such devices with SOI technology reduces the complexity of the process with the added advantage of low capacitances. But while a lateral bipolar transistor can be made for use at microwave frequencies, high power has not been achieved in such devices.

SUMMARY OF THE INVENTION

In the present invention, a self-aligned vertical bipolar transistor is provided in which a high density, high power, microwave frequency device is made using silicon technology.

This device is made according to the present invention by the steps of forming an SOI wafer of n and n+ layers of silicon on an insulating layer on a substrate, implanting an n+ collector through the n layer of silicon into the n+ layer of silicon, depositing a multiple layer of four different materials at opposite sides of an active region on the n layer of silicon, forming a p type base within the active region, forming a p+ contact layer to the base below the multiple layer, forming an n+ polysilicon emitter contact on said p type base within said active region, depositing a dielectric layer over the already formed structure, and providing conductive contacts to the collector and the emitter through the dielectric layer.

The formation of the device according to the present invention provides the four different materials of the multiple layer from a conductive poly silicon layer, a barrier layer, a silicide layer and a layer of a low temperature oxide (LTO).

Further, according to the present invention, the multiple layer is used as a mask to form the base region.

BRIEF DESCRIPTION OF THE DRAWING FIGURES

The features and technique of the present invention is shown by way of example in the attached drawing figures in which distances and sizes have been changed in order to more clearly show the features of the present invention, where:

FIG. 1 is a schematic illustration of the semiconductor device made according to the present invention, and FIGS. 2, 3, 4, 5, 6, 7, 8, 9, 10, 11 and 12 show a sequence of process steps in forming the device of the present invention.

DESCRIPTION OF THE INVENTION

The self aligned vertical bipolar transistor on an SOI device is shown in FIG. 1. In this figure an SOI is formed by an isolated, buried oxide insulating layer, such as $SiO_2$, disposed on a substrate. Various substrate materials are known for substrates in SOI devices, such as sapphire or silicon, but a preferred material for the present invention is silicon for the substrate. On the buried oxide layer 2 is a double layer of silicon, first an n+ type conductivity layer 3 with an n type conductivity layer 4 disposed thereon.

Various oxide portions 5 are disposed on the SOI structure and an n+ type conductivity portion providing the collector 6 is disposed between two of the oxide portions 5. High diffusivity phosphorus may be used to form the collector 6 by sinking n+ dopant through the n conductivity layer 4 to the n+ type layer 3.

Between one of the oxide portions 5 at the collector 6 and a second oxide portion 5, a p type base layer 9 is formed between two base contact portions 8. Over this base 9 is provided an emitter 10 in contact with the base 9 between two sides of the multiple layer 7. An insulating layer 11 of a low temperature oxide (LTO) is provided over the device structure and openings are provided for an emitter contact 12 and a collector contact 13. Both of these contacts are of a conductivity material, such as the metal, Al. The base contacts 8 may run through the structure to the ends where electrical connection is made to the base.

The multiple layers 7 at sides of the base and emitter are provided of a first layer 16 of a p+ poly, covered with TiN 17, a silicide 18 and a LTO portion 19. This multiple layer 7 provides a self-aligning stack to form the base and emitter parts.

This composite structure of a self-aligned vertical bipolar transistor is made according to the steps illustrated in FIGS. 2–12. Thus, in FIG. 2 the SOI structure is formed of the silicon substrate 1, the buried oxide layer 2 of $SiO_2$ and the n+/n layers 3 and 4. The formation of this structure may be the n/n+ silicon film as the starting material. This combined film is formed over the $SiO_2$ isolation insulator 2 which is formed on the silicon substrate 1. The bonded SOI wafer is made with the n epitaxial layer 3 doped with n+ dopant and a follow up oxidation. This formation is made upside down and then bonded to the silicon substrate. The n+ layer 3 under the n layer 4 has a high conductivity in order to be used as a low loss collector.

Subsequently, the oxide portions 5 are formed by a LOCOS technique in which about 500A thick pad oxide is first grown and an about 1000A nitride is deposited by a LPCVD method. While the active area is covered with a photoresist, the nitride and oxide pad are etched away by reactive ion etching (RIE). The nitride is used as an oxidation mask during oxidation to selectively grow the oxide portions 5 on the surface of the SOI wafer. The nitride and oxide pads are then removed leaving the arrangement shown in FIG. 3.

Figure 4:
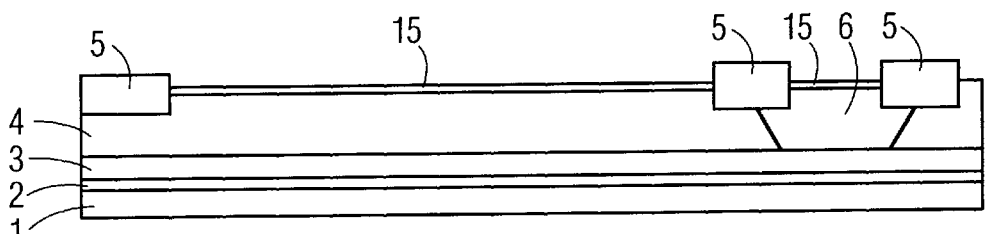
Figure 5:
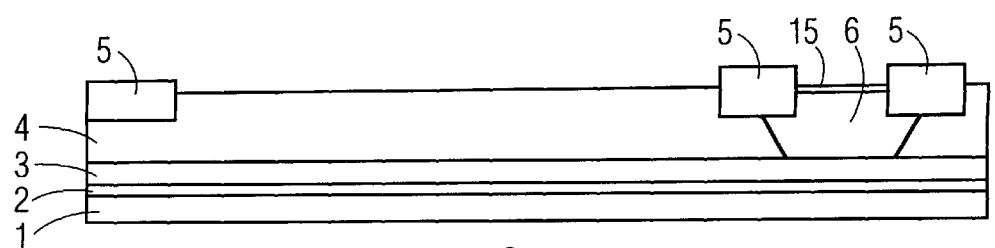

Then, a thin screen oxide layer 15 is grown to about 500A thickness, and a n+ collector sink is implanted, as seen in FIG. 4. High diffusivity phosphorus may be used to be quickly driven into the n+ collector layer 6. Thereafter, the screen oxide 15 oil the active area is removed by etching, as may be seen in FIG. 5. This may be done either by a selective lithographic process or by merely washing away the oxide. In either case, the etching is closely controlled to prevent too much reduction of the LOCOS oxide portions 5.

To provide a self-aligning arrangement a stack of layers of four different type of materials is deposited over the structure. This stack of layers is patterned and anisotopically etched to form the arrangement seen in FIG. 6. In this stack a layer of p+ poly 16, a barrier layer 17 of TiN, a layer 18 of a silicide and a layer 19 of LTO are sequentially deposited to make the composite layer 7. The p+ poly layer 16 and the LTO layer 19 may be deposited by standard CVD, while the silicide layer 18 and TiN barrier layer 17 may be either sputtered onto the deposition surface or reactively made. The TiN barrier layer 17 may be easily made by a reactive sputtering of Ti in a nitrogen atmosphere, or by a thermal reaction of a Ti film with a diluted ammonia gas, for example.

Figure 6:
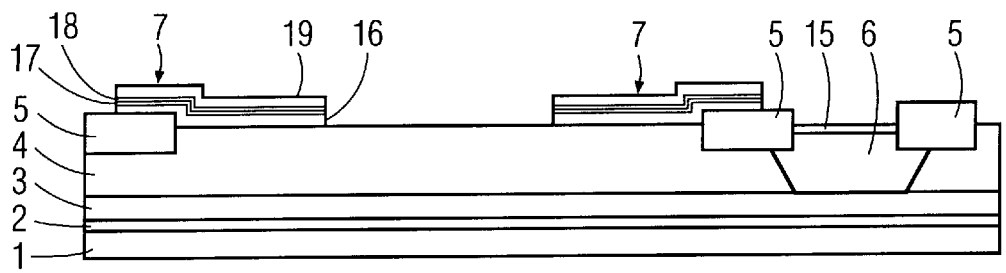

The stack of layers is then patterned and etched to form the arrangement shown in FIG. 6. The different layers can each be anisotropically etched by changing the RIE chemistry for each layer. In practice it is not too difficult because the top oxide layer 19 can be used as an etching mask once it is first patterned and etched. While the total thickness of the composite layer 7 may be about 1 micron, care must be taken to provide the top layer 19 of oxide to be thick enough to maintain dielectric isolation from the subsequently formed n+ poly emitter 10. The appropriate etching produces the self-aligned stack of layers providing the composite layer 7 adjacent to the active area.

Figure 7:
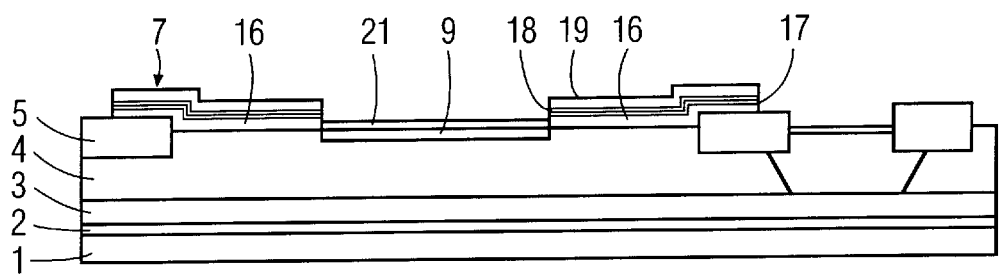

A non-selective oxidation produces an oxide in the exposed active area. This oxidation is a screen oxide 21 for assuring that the later formed p+ base 9 is isolated from the subsequently formed n+ emitter 10. Since the oxidation rate of the poly is much faster than that of the silicon oxidation rate, the lateral oxide growth along the p+ poly layer 16 provides a thickness more than twice the thickness of the screen oxide 21. Therefore, as seen in FIG. 7, the p base 9 is implanted using the stacked layers 7 as a self-aligned mask, and the p base is initially separated from the p+ poly layer 16 to ensure that the p+ contact layer 8 is free of electrical contact with the n+ emitter 10, eliminating any possibility of shorting between the p+ contact layer 8 and the n+ emitter 10. Alternatively, however, if the separation is too large, then a long drive-in of dopant is needed to make an interdiffusion between the p base 9 and the p+ contact layer 8.

Figure 8:
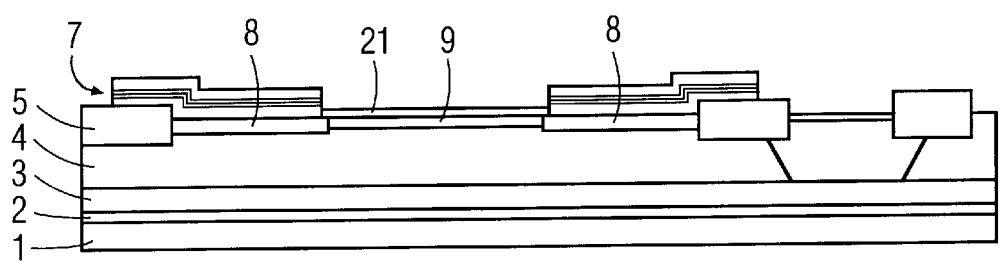

Therefore, as seen in FIG. 8, the p base 9 is driven in at the same time that the heavily doped p+ poly 16 produces the p+ contact 8 below the base. The lateral diffusion of the p+ poly layer 16 can be suppressed because of the lateral oxidation of the poly. During the high temperature process, the TiN barrier layer 17 reduces thermal interaction between the p+ poly layer 16 and the silicide layer 18.

Figure 9:
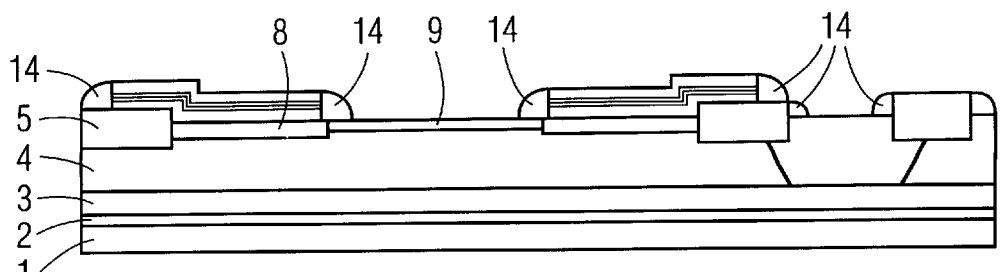

Next, as seen in FIG. 9, oxide spacers 14 are formed at the steps of the stacked composite layer 7 and the oxide. Such oxide spacers can be formed by deposition of LTO material followed by an anisotropic RIE etching. The width of the spacers is determined by the width of the LTO thickness. During formation of the oxide spacers 14, over etching should be minimized in order to not reduce the thickness of the top layer 19 of LTO on the stacked, composite layer 7.

Figure 10:
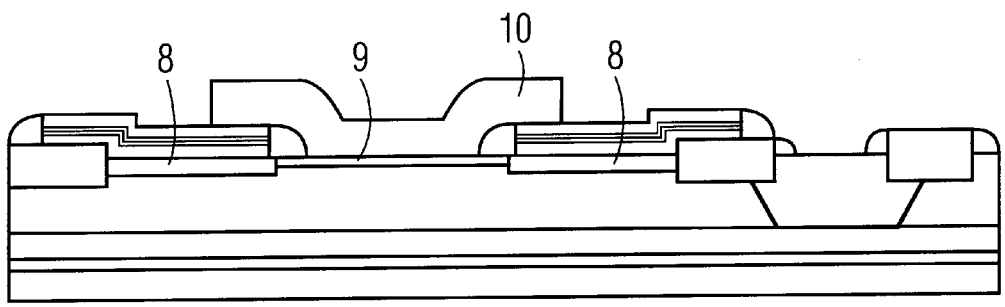

Then, a cleaning of the active area surface over the base 9 is followed by the formation of the n+ emitter 10, as seen in FIG. 10. The heavily doped n+ emitter 10 is deposited and patterned by a conventional lithographic process. Either arsenic or phosphorus may be used as a dopant for the emitter, depending on the desire depth of the emitter junction. For the same drive in conditions, phosphorus provides a deeper emitter junction.

Figure 11:
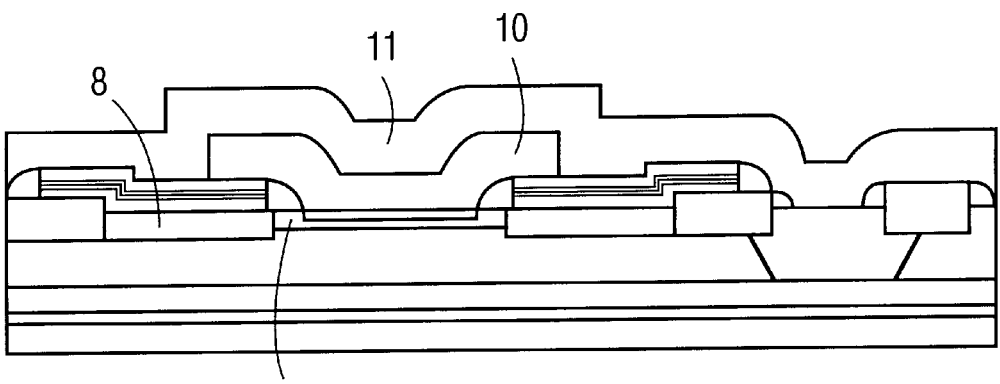
Figure 12:
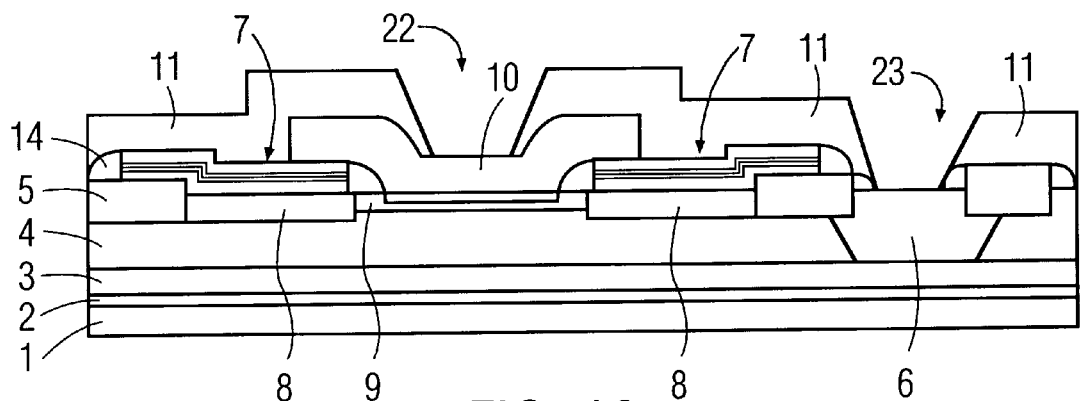

As may be seen in FIG. 11, a thick interlevel dielectric LTO layer 11 is deposited over the structure to provide a metalization level. This layer 11 may be formed to be planar if necessary. Then, as shown in FIG. 12, openings 22 and 23 are formed in the layer 11 by conventional lithography to provide emitter and collector contacts. A uniform oxide layer thickness of the layer 11 makes the contact openings easy to form. The large emitter size further provides a good frame for the contact hole.

Finally, as seen in FIG. 1, metallization into the respective contact holes 22 and 23 provides ohmic contact to the emitter and collector. The metallization may be of aluminum which may also be alloyed with appropriate materials for electrical contacts. The base contacts 8 of the base 9 may run through the device to metal contacts at the end of the SOI device. Also, device isolation can be provided by trench etching through the thin SOI film.

What I claim:

1. A method of manufacturing a vertical, self-aligned bipolar transistor, the method comprising the steps of:
   a) providing a substrate and forming a first layer of a first conductivity type adjacent the substrate, the first layer having a surface;
   b) forming a stack of layers over the surface of the first layer, the stack of layers including a polysilicon layer disposed on the surface of the first layer and doped with a dopant of a second conductivity type, a barrier layer, a silicide layer and an oxide layer, the polysilicon layer being disposed on the surface of the collector layer, the barrier layer being disposed on the polysilicon layer, the silicide layer being disposed on the barrier layer and the oxide layer being disposed on the barrier layer;
   c) patterning and etching the stack of layers so as to expose at the surface of the first layer an active area having an interface with the stack of layers, the layers of the stack having edges substantially vertically aligned at said interface defining the active area;
   d) oxidizing the active area and the polysilicon layer adjacent the active area to form (i) a screen oxide layer from the first layer in the exposed active area and (ii) a lateral oxide in the polysilicon layer in a region contiguous with the active area, a non-oxidized region of the polysilicon layer remaining adjacent to the lateral oxide;
   e) forming an implanted base by implanting a dopant of the second conductivity type through the screen oxide layer, the lateral oxide of the polysilicon layer providing a lateral separation between the non-oxidized region of the polysilicon layer and the implanted base;
   f) selectively driving by diffusion the dopant of the second conductivity type of the polysilicon layer into the first layer to form a base contact;
   g) forming oxide spacers in the active area on the screen oxide layer and contiguous with the edges of the layers of the stack of layers; and
   h) forming an emitter in the active area on the base by depositing dopant of a first conductivity type in the active area.

2. A method of manufacturing a vertical, self-aligned bipolar transistor, the method comprising the steps of:
   a) providing a substrate and forming a first layer of a first conductivity type adjacent the substrate, the first layer having a surface;

b) forming a stack of layers over the surface of the first layer, the stack of layers including a polysilicon layer disposed on the surface of the first layer and doped with a dopant of a second conductivity type, a barrier layer, a silicide layer and an oxide layer, the polysilicon layer being disposed on the surface of the collector layer, the barrier layer being disposed on the polysilicon layer, the silicide layer being disposed on the barrier layer and the oxide layer being disposed on the barrier layer;

c) patterning and etching the stack of layers so as to expose at the surface of the first layer an active area having an interface with the stack of layers, the layers of the stack having edges substantially vertically aligned at said interface defining the active area;

d) oxidizing the active area and the polysilicon layer adjacent the active area to form (i) a screen oxide layer from the first layer in the exposed active area and (ii) a lateral oxide in the polysilicon layer in a region adjacent the active area, a non-oxidized region of the polysilicon layer remaining adjacent to the lateral oxide, the screen oxide layer and the lateral oxide each having a thickness normal to the surface of the first layer, the thickness of the lateral oxide being greater than the thickness of the screen oxide layer, and the lateral oxide having a width dimension in the direction extending laterally away from the interface into the polysilicon layer;

e) forming an implanted base by implanting a dopant of the second conductivity type through the screen oxide layer, the lateral oxide providing a lateral separation between the non-oxidized region of the polysilicon layer and the implanted base;

f) selectively driving by diffusion the dopant of the second conductivity type of the polysilicon layer into the first layer to form a base contact, the lateral oxide suppressing diffusion of the dopants of the second conductivity type of the polysilicon layer into the first layer, the dopant of the second conductivity type of the implanted base inter-diffusing with the dopant of the base contact;

h) forming oxide spacers in the active area on the screen oxide layer and contiguous with the edges of the layers of the stack of layers, the oxide spacers having an interface with the screen oxide;

i) etching the active area with an etchant to remove the screen oxide layer;

j) forming an emitter in the active area on the base by depositing dopant of the first conductivity area in the active area, the emitter and base contact being spaced from each other and defining a lateral separation, and controlling the lateral separation of the emitter relative to the base contact (1) with the oxide spacers and (2) by selectively driving the dopant of the second conductivity type into the base contact such that the emitter and the base contact remain separated, and (k) controlling the width dimension of the lateral oxide in the polysilicon layer during said step of oxidizing to limit etching during removal of the screen oxide layer along the interface of the first layer and the polysilicon layer.

3. A method of manufacturing a vertical, self-aligned bipolar transistor, the method comprising the steps of:

a) providing a substrate and forming a first layer of a first conductivity type adjacent the substrate, the first layer having a surface;

b) forming a stack of layers over the surface of the first layer, the stack of layers including a polysilicon layer disposed on the surface of the first layer and doped with a dopant of a second conductivity type and a top layer of a low temperature oxide, a barrier layer, a silicide layer and an oxide layer, the polysilicon layer being disposed on the surface of the collector layer, the barrier layer being disposed on the polysilicon layer, the silicide layer being disposed on the barrier layer and the oxide layer being disposed on the barrier layer;

c) patterning and etching the stack of layers so as to expose at the surface of the first layer an active area having an interface with the stack of layers, the layers of the stack having edges substantially vertically aligned at said interface defining the active area;

d) oxidizing the active area and the polysilicon layer adjacent the active area to form (i) a screen oxide layer from the first layer in the exposed active area and (ii) a lateral oxide in the polysilicon layer in a region adjacent the active area, a non-oxidized region of the polysilicon layer remaining adjacent to the lateral oxide, the screen oxide layer and the lateral oxide each having a thickness normal to the surface of the first layer, the thickness of the lateral oxide being greater than the thickness of the screen oxide layer, and the lateral oxide having a width dimension in the direction extending laterally away from the interface into the polysilicon layer;

e) forming an implanted base by implanting a dopant of the second conductivity type through the screen oxide layer, the lateral oxide providing a lateral separation between the non-oxidized region of the polysilicon layer and the implanted base;

f) selectively driving by diffusion the dopant of the second conductivity type of the polysilicon layer into the first layer to form a base contact, the lateral oxide suppressing diffusion of the dopant of the second conductivity type of the polysilicon layer into the first layer, the dopant of the second conductivity type of the implanted base inter-diffusing with the dopant of the base contact;

h) forming oxide spacers in the active area on the screen oxide layer and contiguous with the edges of the layers of the stack of layers, the oxide spacers having an interface with the screen oxide;

i) etching the active area with an etchant to remove the screen oxide layer;

j) forming an emitter in the active area on the base by depositing dopant of the first conductivity type in the active area such that (i) said emitter is isolated from said base contacts by said top layer of low temperature oxide and said oxide spacers and (ii) the emitter is spaced from the base contact by a lateral separation, and controlling the lateral separation of the emitter relative to the base contact (1) with the oxide spacer and (2) by selectively driving the dopant of the second conductivity type into the base contact such that the emitter and the base contact remain separated; and (k) controlling the width dimension of the lateral oxide in the polysilicon layer during said step of oxidizing to limit etching during removal of the screen oxide layer along the interface of the first layer and the polysilicon layer.

4. The method of claim 1, wherein the step of forming the barrier layer comprises using TiN.

5. The method of claim 4, wherein the step of forming the oxide layer comprises using LTO.

6. The method of claim 1, wherein the step of forming the oxide layer comprises using LTO.

7. The method of claim 1, wherein the step of forming the oxide layer comprises having an oxide layer thickness sufficient to provide dielectric isolation from the emitter.

8. The method of claim 1, wherein the step of patterning and etching the stack of layers comprises anisotropic etching of the layers.

9. The method of claim 1, further comprising the step of forming oxide portions for generally defining the active area.

10. The method of claim 2, wherein the step of forming the barrier layer comprises using TiN.

11. The method of claim 10, wherein the step of forming the oxide layer comprises using LTO.

12. The method of claim 2, wherein the step of forming the oxide layer comprises using LTO.

13. The method of claim 2, wherein the step of forming the oxide layer comprises having an oxide layer thickness sufficient to provide dielectric isolation from the emitter.

14. The method of claim 3, wherein the step of forming the barrier layer comprises using TiN.

15. The method of claim 14, wherein the step of forming the oxide layer comprises using LTO.

16. The method of claim 3, wherein the step of forming the oxide layer comprises using LTO.

17. The method of claim 3, wherein the step of forming the oxide layer comprises having an oxide layer thickness sufficient to provide dielectric isolation from the emitter.

* * * * *